(12) United States Patent
Kim et al.

(10) Patent No.: US 7,135,746 B2
(45) Date of Patent: Nov. 14, 2006

(54) SRAM CELLS HAVING LANDING PAD IN CONTACT WITH UPPER AND LOWER CELL GATE PATTERNS AND METHODS OF FORMING THE SAME

(75) Inventors: Sung-Jin Kim, Gyeonggi-do (KR);
Soon-Moon Jung, Gyeonggi-do (KR);
Won-Seok Cho, Gyeonggi-do (KR);
Jae-Hoon Jang, Gyeonggi-do (KR);
Kun-Ho Kwak, Gyeonggi-do (KR);
Jong-Hyuk Kim, Incheon (KR);
Jae-Joo Shim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/268,138

(22) Filed: Nov. 7, 2005

(65) Prior Publication Data

US 2006/0097328 A1    May 11, 2006

(30) Foreign Application Priority Data

Nov. 8, 2004    (KR) ...................... 10-2004-0090608

(51) Int. Cl.
*H01L 29/76* (2006.01)
*H01L 29/94* (2006.01)
(52) U.S. Cl. ...................... 257/393; 257/903
(58) Field of Classification Search ............... 257/393, 257/368, 903; 438/152–153
See application file for complete search history.

(56) References Cited

U.S. PATENT DOCUMENTS 5,001,539 A * 3/1991 Inoue et al. ................. 365/182
5,612,552 A * 3/1997 Owens ........................ 257/202
6,429,484 B1   8/2002 Yu

FOREIGN PATENT DOCUMENTS

| JP | 2000-114453 | 4/2000 |
| KR | 1020020096743 A | 12/2002 |
| KR | 1020040069585 | 8/2004 |

OTHER PUBLICATIONS

Office Action from Korean Patent Office for Korean Patent Application No. 10-2004-0090608 mailed May 25, 2006.

* cited by examiner

*Primary Examiner*—Theresa T. Doan
(74) *Attorney, Agent, or Firm*—Myers Bigel Sibley & Sajovec

(57) ABSTRACT

SRAM cells having landing pads in contact with upper and lower cell gate patterns, and methods of forming the same are provided. The SRAM cells and the methods remove the influence resulting from structural characteristics of the SRAM cells having vertically stacked upper and lower gate patterns, for stably connecting the patterns on the overall surface of the semiconductor substrate. An isolation layer isolating at least one lower active region is formed in a semiconductor substrate of the cell array region. The lower active region has two lower cell gate patterns. A body pattern is disposed in parallel with the semiconductor substrate. The body pattern is formed to confine an upper active region, which has upper cell gate patterns on the lower cell gate patterns. A landing pad is disposed between the lower cell gate patterns. A node pattern is formed to simultaneously contact the upper cell gate pattern and the lower cell gate pattern.

12 Claims, 17 Drawing Sheets

006
SRAM CELLS HAVING LANDING PAD IN CONTACT WITH UPPER AND LOWER CELL GATE PATTERNS AND METHODS OF FORMING THE SAME

CROSS-REFERENCE TO RELATED APPLICATION

This patent application claims priority from Korean Patent Application No. 10-2004-0090608, filed Nov. 8, 2004, the contents of which are hereby incorporated by reference in their entirety.

BACKGROUND OF INVENTION

1. Technical Field

The present invention relates to SRAM (Static Random Access Memory) cells and methods of forming the same, and more particularly, to SRAM cells having a landing pad in contact with upper and lower cell gate patterns and methods of forming the same.

2. Discussion of the Related Art

In semiconductor memory devices, a static random access memory (SRAM) device may offer advantages of lower power consumption and faster operating speed as compared to a dynamic random access memory (DRAM) device. Therefore, the SRAM may be widely used for cache memory in computer and/or other portable devices.

A unit cell of a SRAM device mat be categorized as either a resistor-load SRAM cell or a complementary metal-oxide semiconductor (CMOS) SRAM cell. A resistor-load SRAM cell may employ a high-resistance resistor as a load device, while a CMOS SRAM cell may employ a p-channel metal-oxide semiconductor (PMOS) transistor as a load device.

The CMOS SRAM cell may be categorized as one of two types. One type of CMOS SRAM cell is a thin film transistor (TFT) SRAM cell, which may employ TFTs stacked on a semiconductor substrate as the load device. The other is a bulk CMOS SRAM cell, which may employ bulk transistors formed on a semiconductor substrate as the load device.

The bulk CMOS SRAM cell may exhibit higher cell stability as compared to the TFT SRAM cell and the resistor-load SRAM cell. In other word, the bulk CMOS SRAM cell may have excellent low voltage characteristics and low stand-by current. This may be because the transistors that make up the bulk CMOS SRAM cell are typically formed of a single crystalline silicon substrate. In contrast, the TFTs of the TFT SRAM cell are typically formed using a polysilicon layer as a boby layer. However, the bulk CMOS SRAM cell may have lower integration density as well as weaker latch-up immunity as compared to the TFT SRAM cell. Therefore, in order to produce a highly integrated SRAM device having high reliability, characteristics of load transistors employed in the TFT SRAM cell may need to be improved.

In addition, each of the SRAM cells may include a pair of node contact structures. More particularly, in the TFT SRAM cell, each of the node contact structures may electrically connect a P-type drain region of a load transistor to an N-type drain region of a driver transistor.

U.S. Pat. No. 6,429,484 to Bin Yu (the '484 patent) discloses a multiple active layer structure and a method of making such a structure. According to the '484 patent, the structure and the method include a first layer having an oxide layer, a first active semiconductor layer and a first insulating layer, which are sequentially stacked. A second active layer is formed on the first insulating layer. The second active layer is recrystallized through a first seed window in the first insulating layer. A second insulating layer is formed on the second active layer.

The structure and the method further include a third active layer on the second insulating layer. The third active layer is recrystallized through a second seed window. The second seed window is aligned with the first seed window. At this time, at least one transistor is disposed in at least a portion of the first active layer. At least another transistor is formed in at least a portion of the second active layer. Further, at least still another transistor is formed in at least a portion of the third active layer.

However, the transistor is composed of a gate structure including a gate dielectric layer, a polysilicon conductive layer and spacers on sidewalls of the polysilicon conductive layer. At this time, the spacers and the active layers have different etch rates from one another. And each of the first and the second seed windows is formed adjacent to the spacer. Accordingly, the first seed window or the second seed window may increase in a probability of having different diameters from each other in an upper and a lower portions thereof due to the etch rate difference between the spacers and the active layers and due further to gradual reduction of a given design rule. Accordingly, the first seed window or the second seed window may have different diameters in the upper and lower portions thereof to deteriorate electrical characteristics of the structure.

SUMMARY OF THE INVENTION

SRAM cells having a landing pad in contact with upper and lower cell gate patterns and methods of forming the same according to embodiments of the invention include a device isolation layer, which is isolating at least one lower active region in a semiconductor substrate of the cell array region. A body pattern is disposed in parallel with the semiconductor substrate. The body pattern is disposed on a vertical line passing through the lower active region so as to confine an upper active region. Two lower cell gate patterns are disposed on the lower active region. Upper cell gate patterns are disposed on the lower cell gate patterns so as to overlap the lower cell gate patterns respectively and disposed in opposite to each other on the body pattern. A landing pad is in contact with one of the upper cell gate patterns and the body pattern, and disposed between the lower cell gate patterns. A node pattern is spaced away from the landing pad with a predetermined distance, and disposed in contact with the remaining upper cell gate patterns and the underneath lower cell gate pattern. A semiconductor buffer layer is disposed to surround portions of sidewalls of the node pattern and the landing pad, and to conformally cover the upper active region and the upper cell gate patterns. The node pattern and the landing pad contact the device isolation layer and the semiconductor substrate respectively. And interfaces between sidewalls of the upper cell gate patterns and the semiconductor buffer layer have a predetermined angle with respect to a main surface of the semiconductor substrate.

Methods of forming the SRAM cells according to embodiments of the invention include forming a device isolation layer in a semiconductor substrate of the cell array region. The isolation layer is formed to isolate at least one lower active region. Two lower cell gate patterns are sequentially formed on the lower active region. A buried interlayer insulating layer covers the lower cell patterns. A sacrificial layer pad is formed between the lower cell gate patterns passing the buried interlayer insulating layer. A body pattern is formed on the buried interlayer insulating layer. The body pattern is formed to extend from one of the lower cell gate patterns and overlap the sacrificial layer pad, and concurrently, to confine an upper active region. Upper cell gate patterns are formed facing each other on the upper active region. The upper cell gate patterns are formed to overlap the lower cell gate patterns respectively. A semiconductor buffer layer is formed on the buried interlayer insulating layer to conformally cover the upper gate patterns. Pad holes are formed to be confined by the buried interlayer insulating layer together with the semiconductor buffer layer, thereby exposing the semiconductor substrate and the device isolation layer respectively. A landing pad and a node pattern are formed to fully fill the pad holes respectively. The pad hole exposing the device isolation layer is formed to expose one of the upper cell gate patterns and the underneath lower cell gate pattern. And the pad hole exposing the semiconductor substrate is formed to remove the sacrificial layer pad, and expose the remaining upper cell gate pattern and the body pattern.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denote like parts.

DETAILED DESCRIPTION OF THE INVENTION

Figure 1:
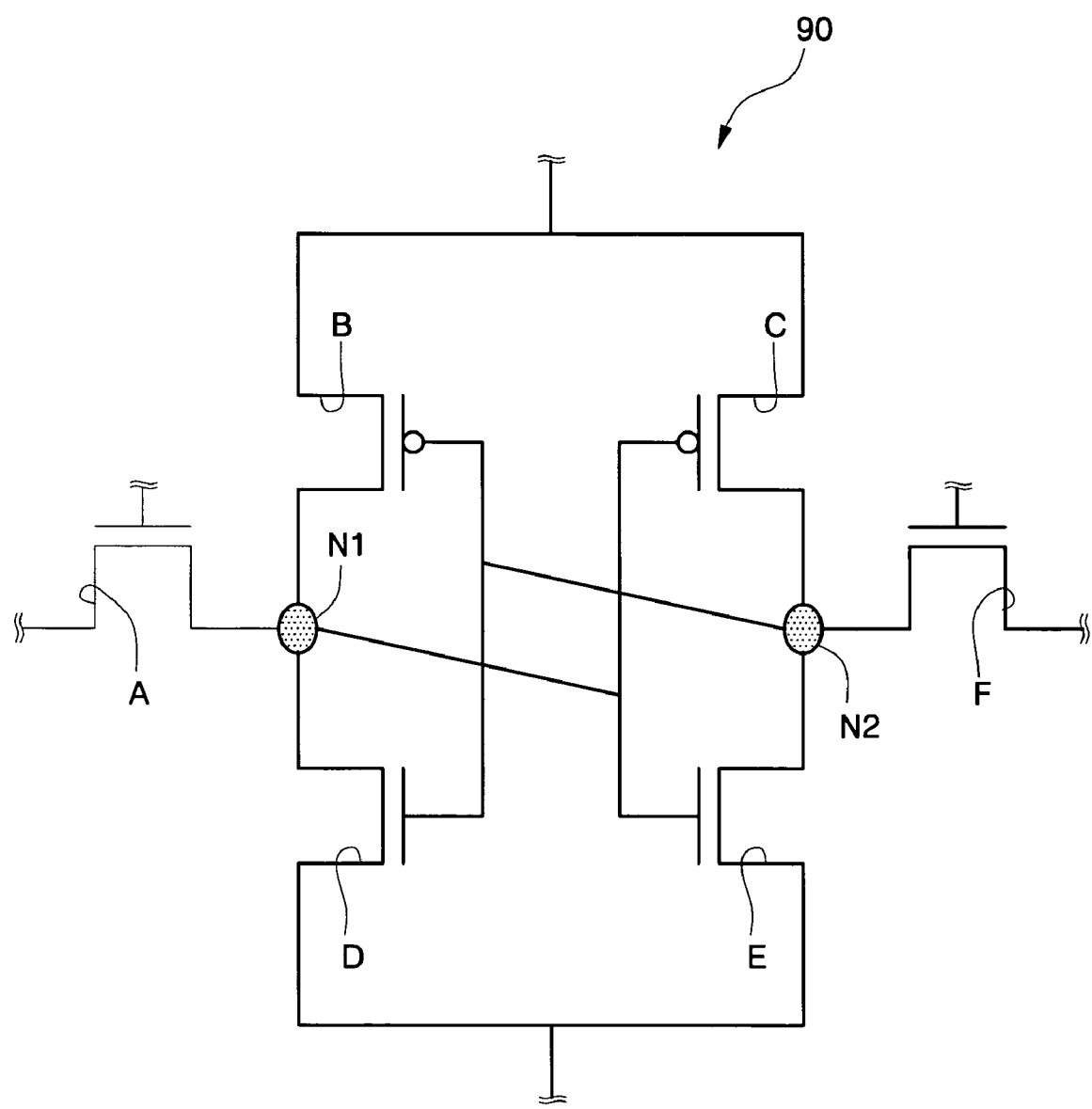
FIG. 1 is a circuit diagram illustrating an SRAM cell in a cell array region according to the present invention.
Figure 2:
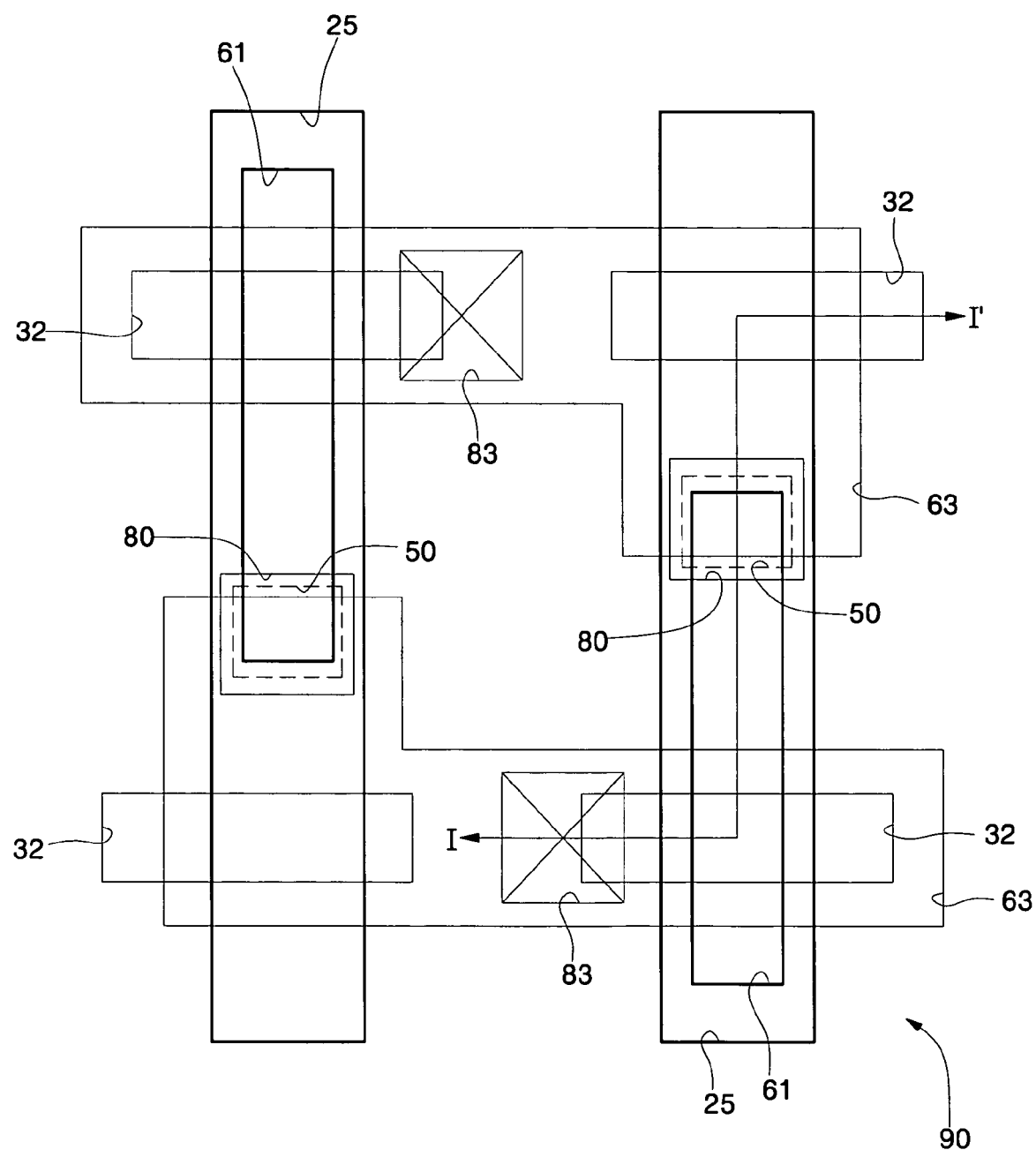
FIG. 2 is a layout view illustrating the SRAM cell of FIG. 1.

FIG. 1 is a circuit diagram illustrating an SRAM cell in a cell array region according to the present invention, and FIG. 2 is a layout view illustrating the SRAM cell of FIG. 1. Further, FIG. 3 is a cross sectional view of the SRAM cell taken along line I–I' of FIG. 2.

Figure 3:
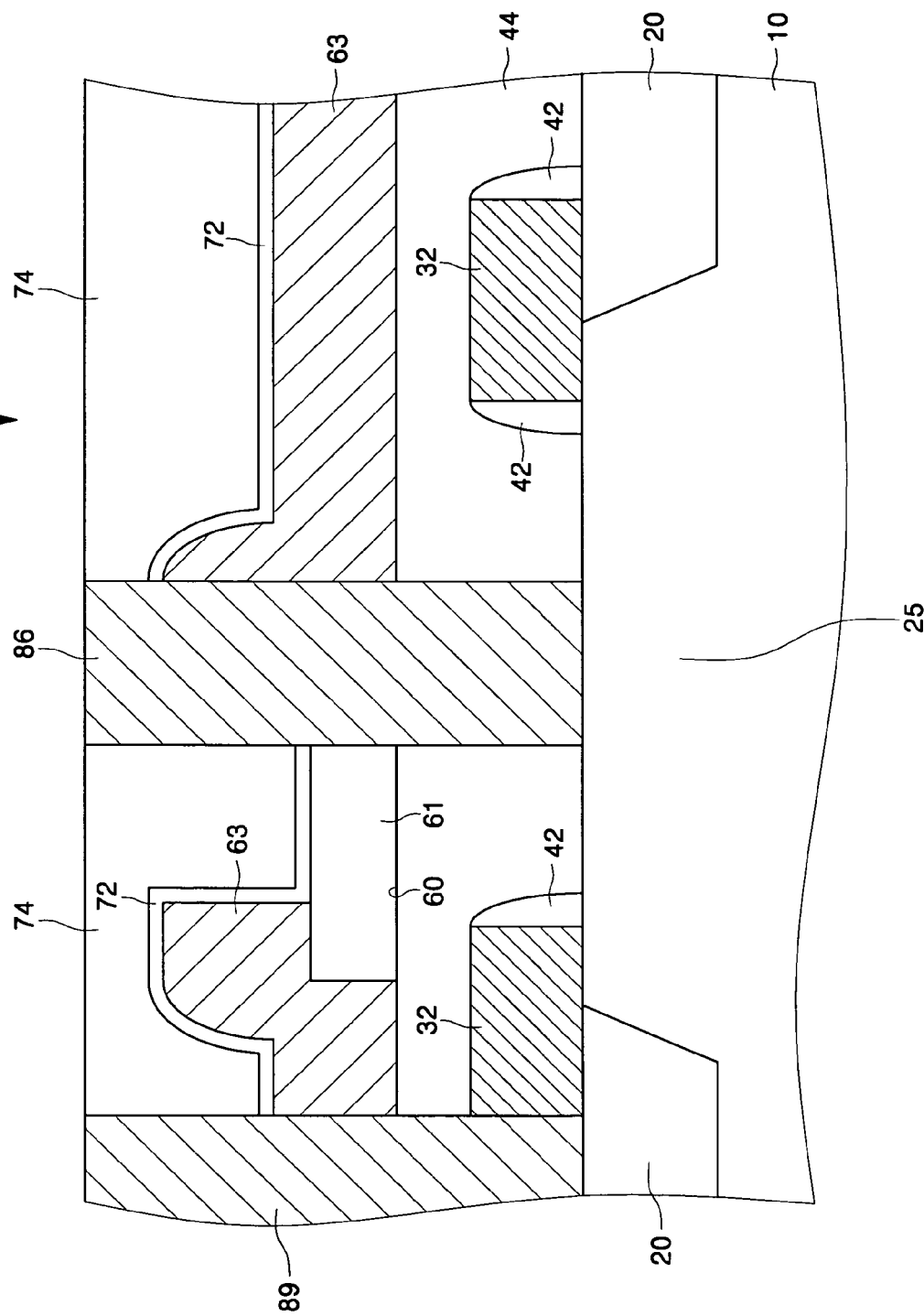
FIG. 3 is a cross sectional view of the SRAM cell taken along line I–I' of FIG. 2.
Figure 4:
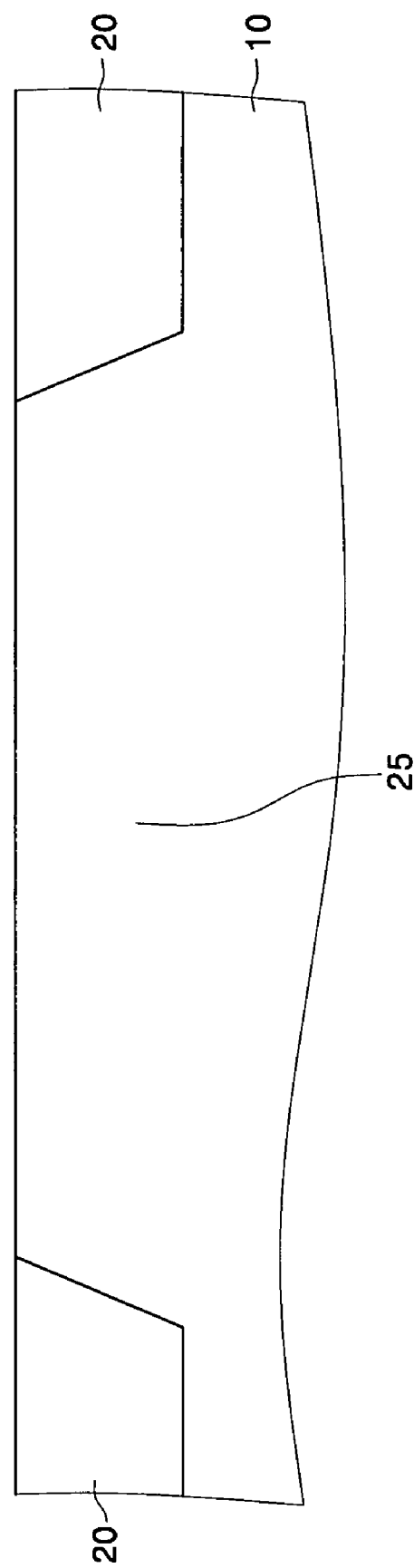
FIGS. 4 to 17 are cross sectional views illustrating a method of forming an SRAM cell taken along line I–I' of FIG. 2 respectively.

Referring to FIGS. 1 to 3, an SRAM cell normally has six transistors A, B, C, D, E, and F within one cell of a cell array region. The transistors A, B, C, D, E, and F constitute a latch structure and show electrical characteristics of the latch structure. That is, two transistors B and D among the transistors A, B, C, D, E, and F are connected to one electrical node N2 together with three opposite transistors C, E, and F. And two transistors C and E among the transistors A, B, C, D, E, and F are connected to the other electrical node N1 together with three opposite transistors A, B, and D. At this time, two transistors B and C among the transistors A, B, C, D, E, and F are P-type MOSFET (Metal Oxide Semiconductor Field Effect Transixtor), and the remaining transistors A, D, E, and F are N-type MOSFET. At this time, the transistors A, B, C, D, E, and F may be disposed to have the latch structure as shown in FIG. 2. A cross sectional structure taken along line I–I' of FIG. 2 can be explained with reference in FIG. 3 as follows.

A device isolation layer 20 is disposed in a semiconductor substrate 10 to isolate at least one lower active region 25. The device isolation layer 20 is preferably composed of at least one silicon oxide layer ($SiO_2$) and at least one silicon nitride layer ($Si_3N_4$), which are sequentially stacked. The lower active region 25 preferably comprises impurity regions of an N-type MOSFET. The semiconductor substrate 10 is preferably composed of single crystal silicon. The semiconductor substrate 10 preferably comprises P-type impurity ions.

A body pattern 60 is disposed on a vertical line passing through the lower active region 25 and in parallel with the semiconductor substrate 10. The body pattern 60 confines an upper active region 61. The body layer 60 comprises preferably polycrystal silicon. The upper active region 61 preferably comprises impurity regions of a P-type MOSFET.

Two lower cell gate patterns 32 are disposed on the semiconductor substrate 10 of the lower active region 25. Lower gate spacers 42 are preferably disposed to cover sidewalls of the lower cell gate patterns 32. Alternatively, the lower gate spacers 42 may not be disposed on the sidewalls of the lower cell gate patterns 32. Upper cell gate patterns 63 are disposed over the lower cell gate patterns 32 and overlap the lower cell gate patterns 32 respectively. One of the upper cell gate patterns 63 is disposed on the body pattern 60. The upper and lower cell gate patterns 63 and 32 comprises preferably a doped polysilicon layer. The lower gate spacers 42 preferably have an etch rate different from that of the silicon oxide layer.

A landing pad 86 is disposed to contact the body pattern 60 and one of the upper cell gate patterns 63, and located between the lower cell gate patterns 32. Further, a node pattern 89 is disposed to be spaced away from the landing pad 86 and contact the remaining upper cell gate pattern 63 and the underneath cell gate pattern 32. At this time, the node pattern 89 and the landing pad 86 contact the device isolation layer 20 and the semiconductor substrate 10 respectively. The node pattern 89 and the landing pad 86 comprise preferably a conductive layer. The node pattern 89 and the landing pad 86 are preferably composed of a polysilicon layer and a metal suicide layer, which are sequentially doped. Alternatively, the node pattern 89 and the landing pad 86 may singly be a doped polysilicon layer. The node pattern 89 and the landing pad 86 may singly be an metal layer.

A semiconductor buffer layer 72 is disposed to surround portions of sidewalls of the node pattern 89 and the landing pad 86. The semiconductor buffer layer 72 conformally covers the body pattern 60 and the upper cell gate patterns 63. The semiconductor buffer layer 72 is preferably a silicon oxide layer. At this time, interfaces between sidewalls of the upper cell gate patterns 63 and the semiconductor buffer layer 72 have a predetermined angle with respect to a main surface of the semiconductor substrate 10.

A buried interlayer insulating layer 44 may be disposed below the upper cell gate patterns 63 to surround the landing pad 86 and the node pattern 89. The buried interlayer insulating layer 44 is preferably an insulating layer covering the lower cell gate patterns 32 and having the same etch rate as that of the semiconductor buffer layer 72. A planarized interlayer insulating layer 74 may be disposed on the upper cell gate patterns 63 to surround the landing pad 86 and the node pattern 89. The planarized interlayer insulating layer 74 is preferably an insulating layer covering the semiconductor buffer layer 72 and having the same etch rate as that of the semiconductor buffer layer 72.

Now hereinafter, methods of forming SRAM cells having landing pads in contact with upper and lower cell gate patterns will be described.

FIGS. 4 to 17 are cross sectional views illustrating a method of forming an SRAM cell taken along line I–I' of FIG. 2 respectively.

Referring to FIG. 2 and FIGS. 4 to 6, an device isolation layer 20 is formed in a semiconductor substrate 10 of one cell of a cell array region. The isolation layer 20 is formed to isolate at least one lower active region 25. The isolation layer 20 is preferably formed using at least one silicon oxide ($SiO_2$) layer and at least one silicon nitride ($Si_3N_4$) layer, which are sequentially stacked. The semiconductor substrate 10 is preferably formed using single crystal silicon. The semiconductor substrate 10 is preferably formed to have P-type impurity ions.

Figure 5:
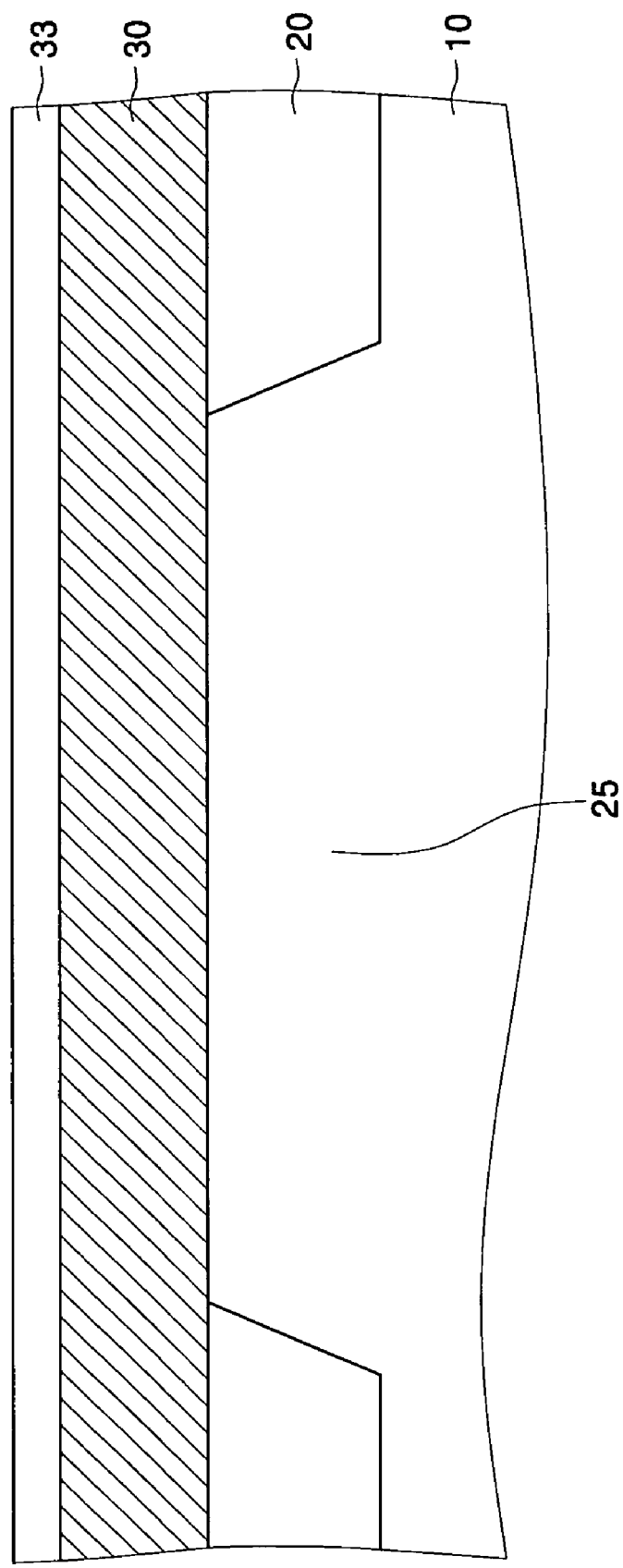

A gate layer 30 and a gate capping layer 33 are sequentially formed on a main surface of the semiconductor substrate 10 to cover the isolation layer 20, as shown in FIG. 5. The gate capping layer 33 is preferably formed using a silicon oxynitride ($Si_xO_yN_z$) layer or a silicon nitride layer. The gate layer 30 is preferably formed using a doped polysilicon layer.

Figure 6:
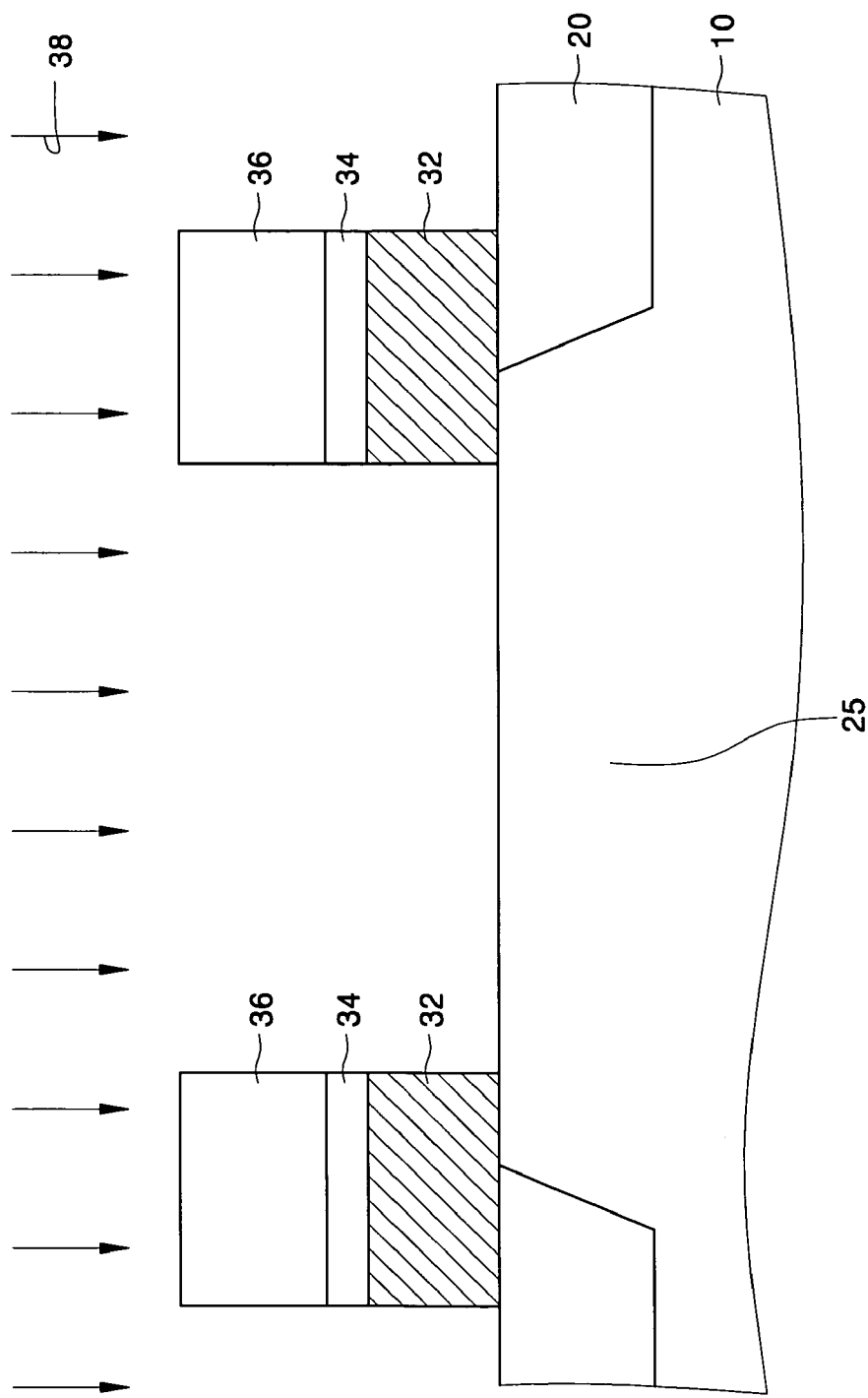
Figure 7:
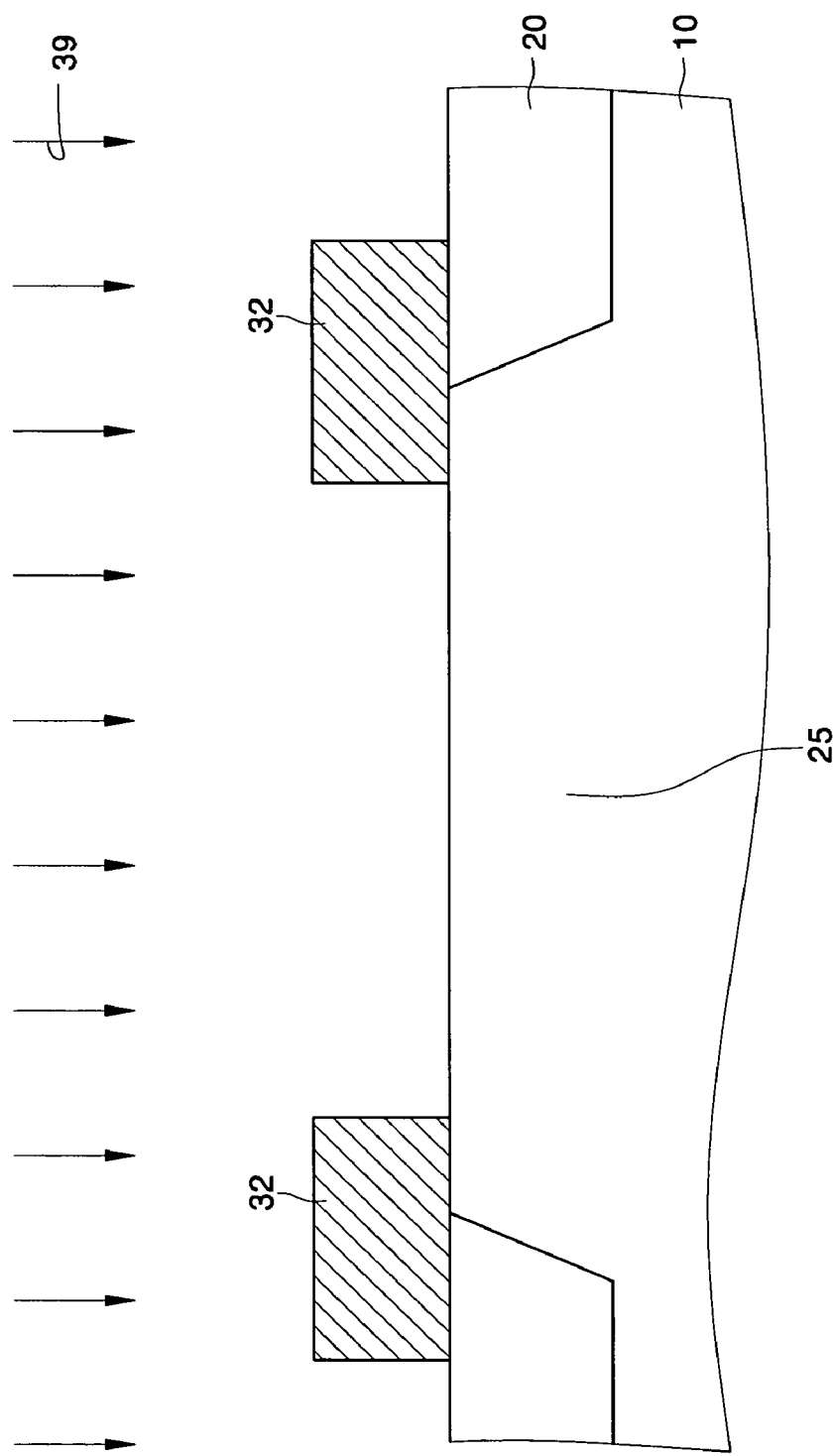

Photoresist patterns 36 are formed on the gate capping layer 33, as shown in FIG. 6. An etch process 38 is sequentially performed on the gate capping layer 33 and the gate layer 30, using the photoresist patterns 36 as an etch mask. The etch process 38 forms two lower cell gate patterns 32 between the photoresist patterns 36 and the lower active region 25 of the semiconductor substrate 10 respectively. Further, gate capping layer patterns 34 are respectively disposed on the lower cell gate patterns 32. At this time, the lower cell gate patterns 32 and the gate capping layer patterns 34 expose the semiconductor substrate 10.

Referring to FIG. 2 and FIGS. 7 to 9, an etch process 39 is performed to remove the photoresist patterns 36 and the gate capping layer patterns 34 from the semiconductor substrate 10. The etch process 39 is preferably performed using an etchant having an etch rate with respect to the photoresist patterns 36 and the gate capping layer patterns 34.

Figure 8:
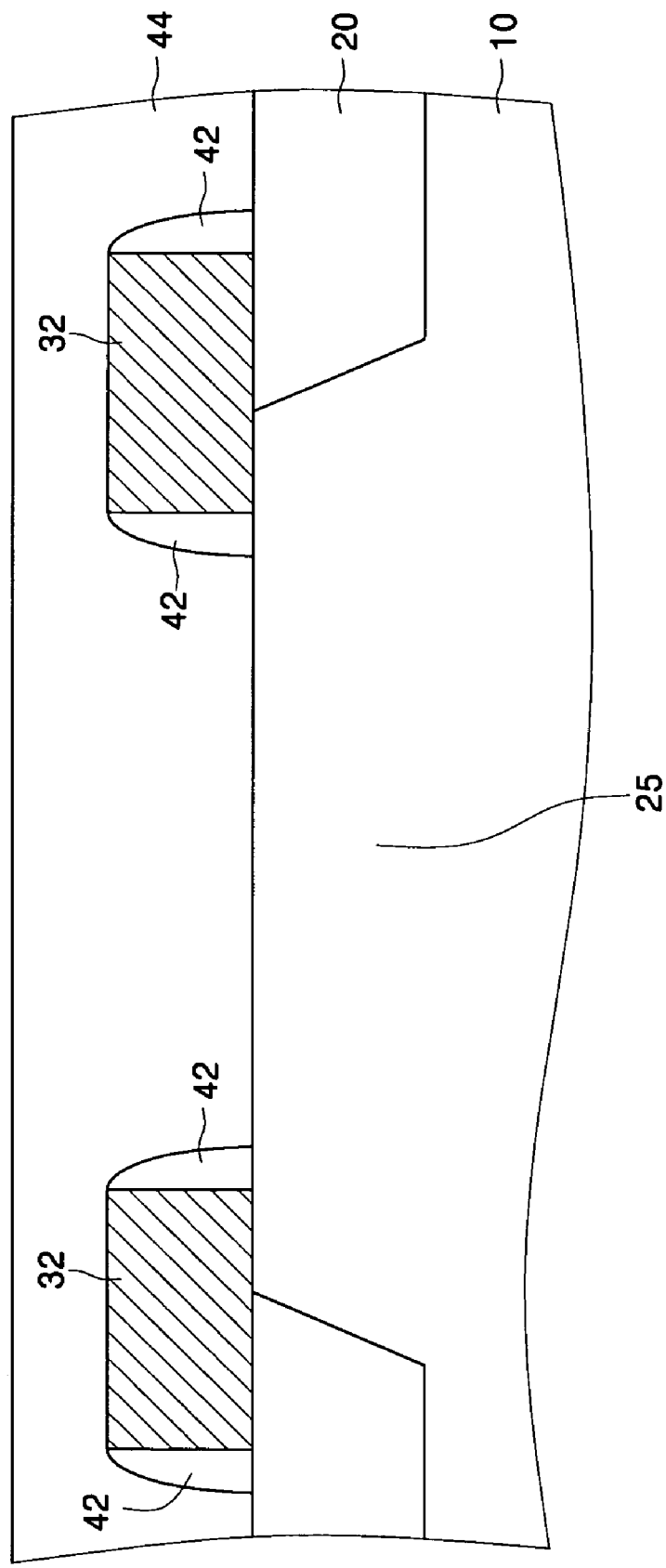

Lower gate spacers 42 are formed to cover the sidewalls of each of the lower cell gate patterns 32 respectively, as shown in FIG. 8. The lower gate spacers 42 are preferably formed using an insulating layer having an etch rate different from that of a silicon oxide layer. Together with the formation of the lower gate spacers 42, the lower active region 25 may be simultaneously formed to include N-type impurity regions. The N-type impurity regions may be formed using impurity ions predictable to constitute an N-type MOSFET (metal oxide semiconductor field effect transistor). A buried interlayer insulating layer 44 is formed on the semiconductor substrate 10 to fully fill between the lower cell gate patterns 32. The buried interlayer insulating layer 44 is preferably formed using an insulating layer having an etch rate different from that of the lower gate spacer 42.

Figure 9:
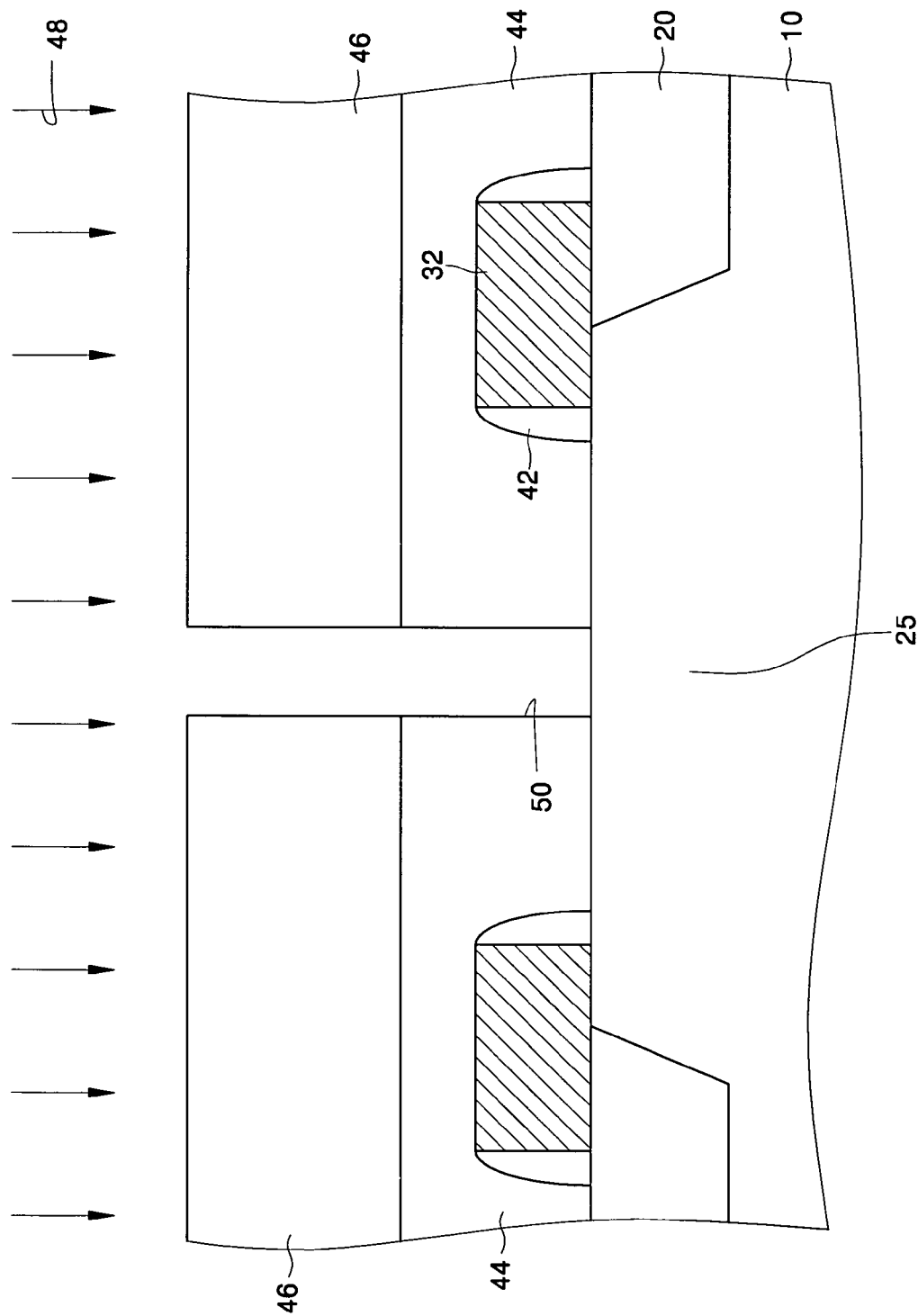

A photoresist layer 46 is formed on the buried interlayer insulating layer 44, as shown in FIG. 9. The photoresist layer 46 is preferably formed to have an opening on the buried interlayer insulating layer between the lower cell gate patterns 32. An etch process 48 is performed on the buried interlayer insulating layer 44 through the opening, using the photoresist layer 46 as an etch mask. The etch process 48 forms a contact hole 50 exposing the semiconductor substrate 10 between the lower cell gate patterns 32.

Figure 10:
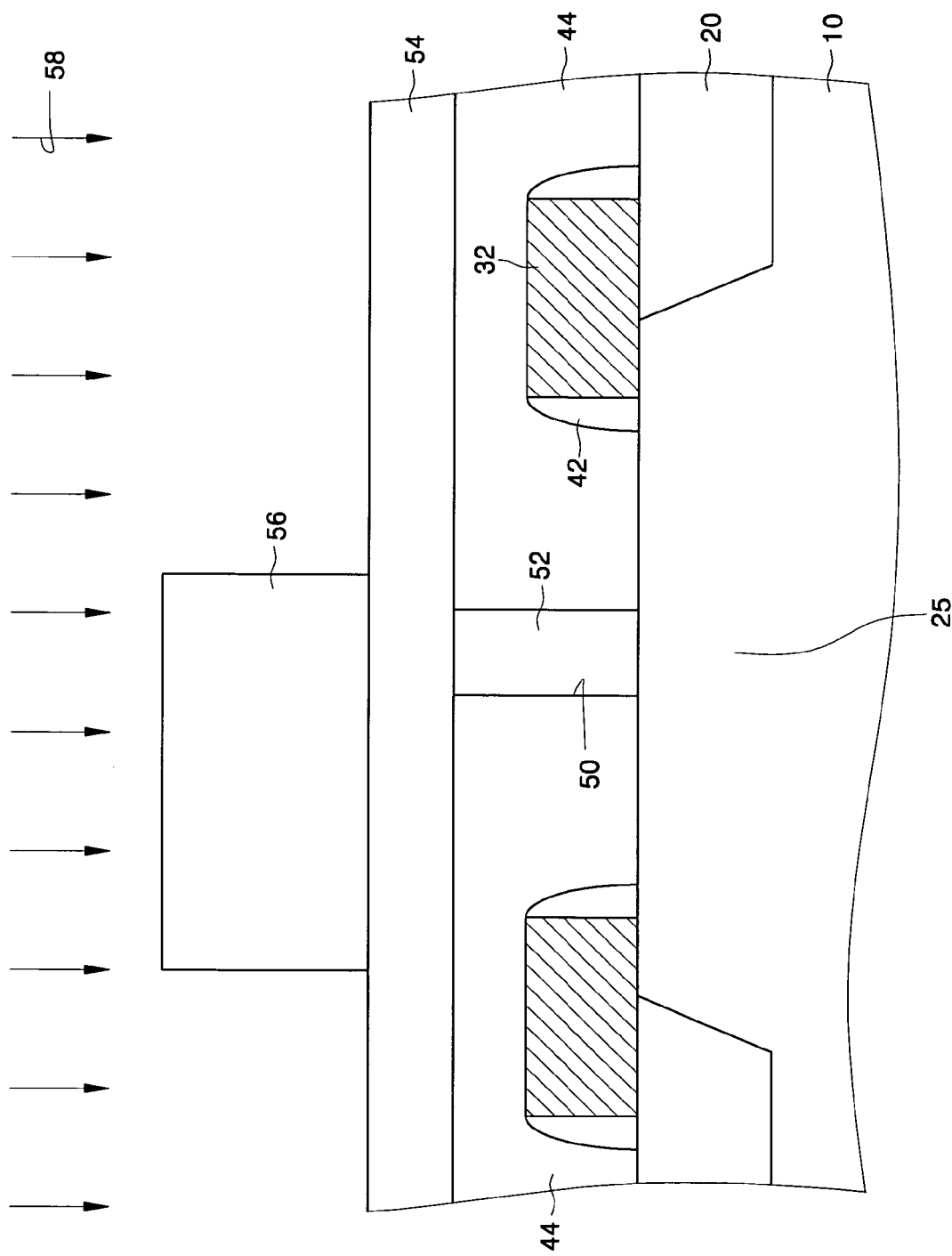
Figure 11:
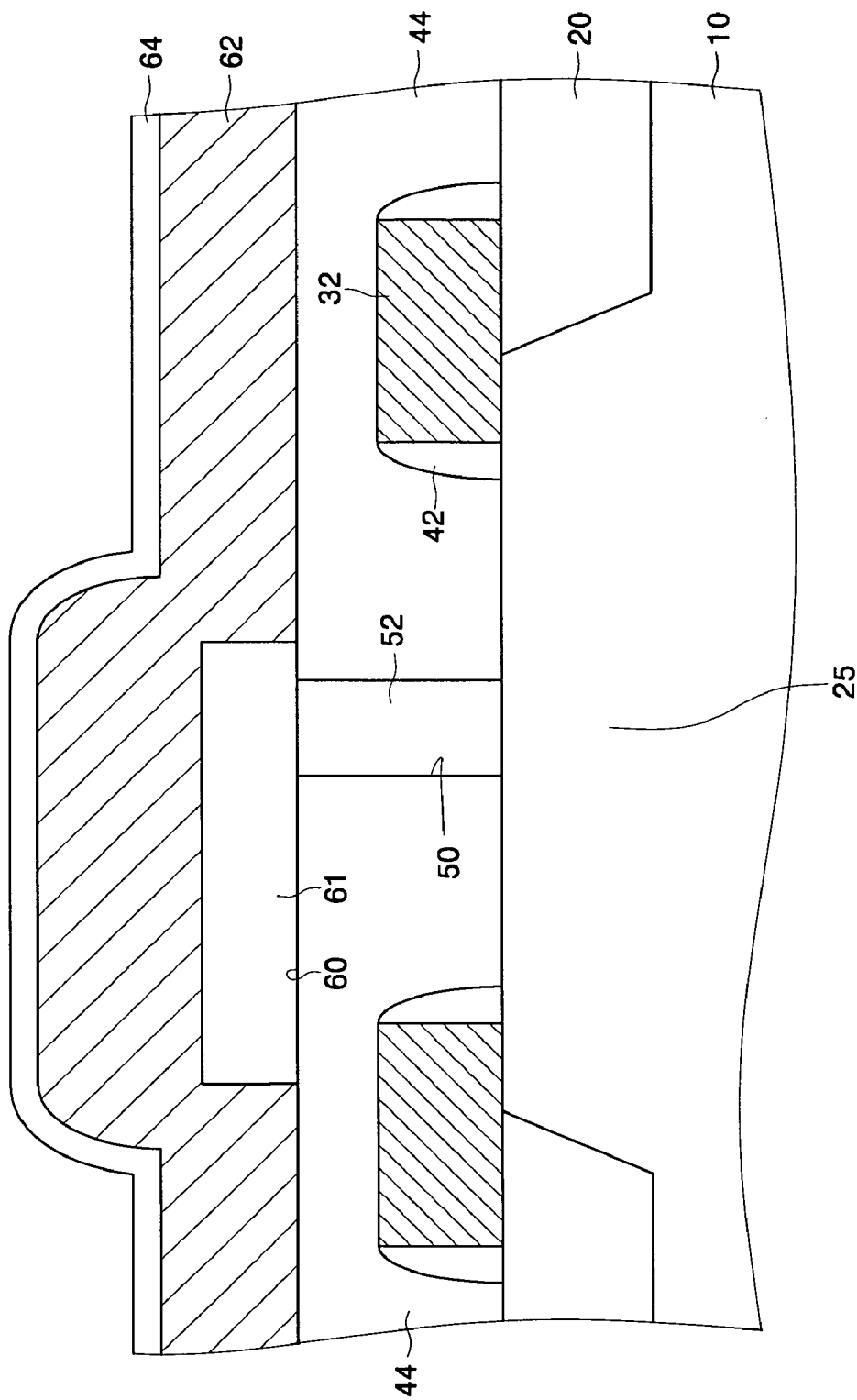
Figure 12:
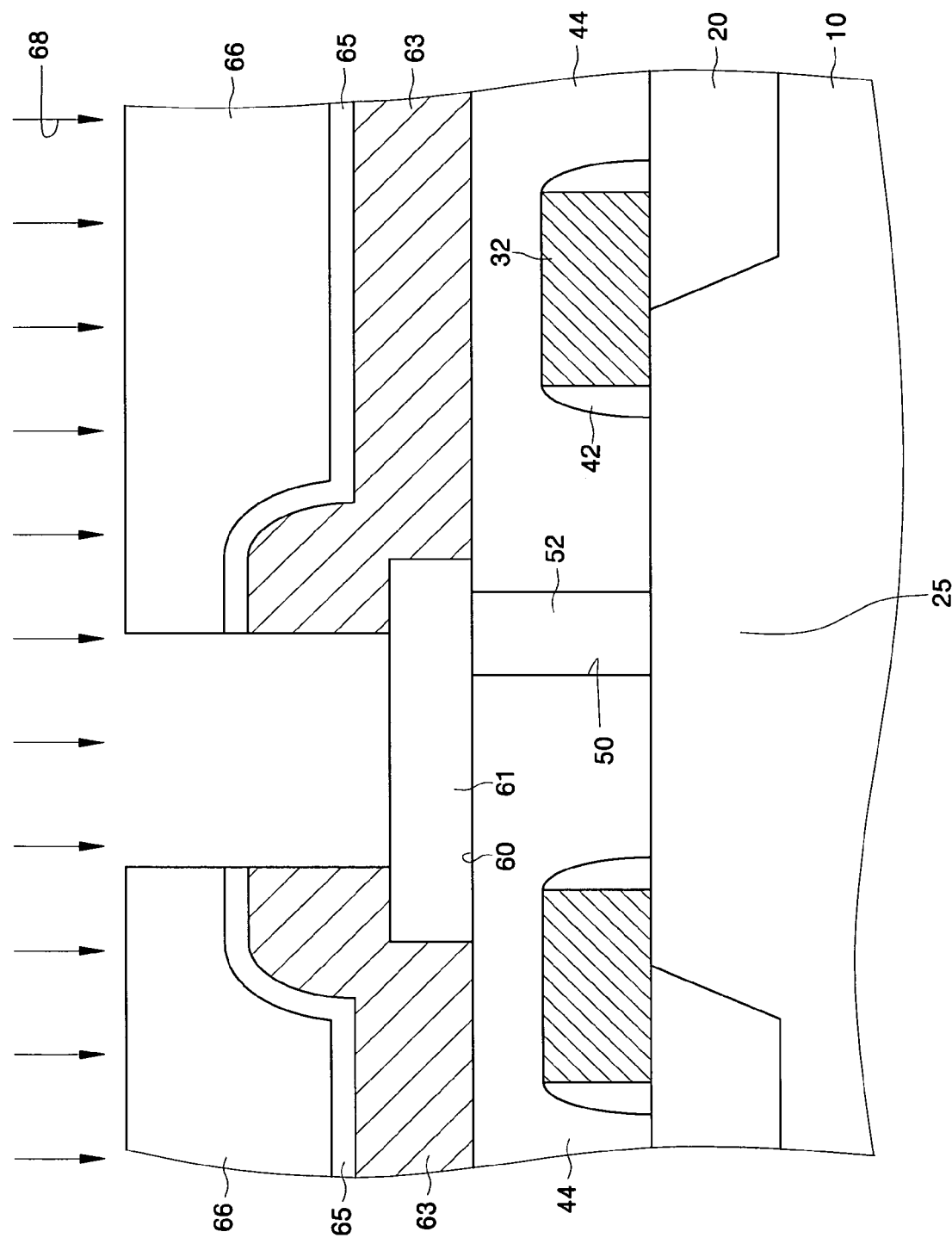

Referring to FIGS. 2, 10 and 11, the photoresist layer 46 is removed from the semiconductor substrate 10. A single crystal selective epitaxial growth layer is formed in the contact hole 50, using the semiconductor substrate 10 as a seed. A planarization process (not shown) is performed on the selective epitaxial growth layer until the buried interlayer insulating layer 44 is exposed. The planarization process forms a sacrificial layer pad 52 filling the contact hole 50. The planarization process is preferably performed using a chemical mechanical polishing technique or an etch back technique.

A polycrystal epitaxial growth layer 54 is formed on the buried interlayer insulating layer 44, using the sacrificial layer pad 52 as a seed, as shown in FIG. 10. A photoresist pattern 56 is formed on the polycrystal epitaxial growth layer 54. An etch process 58 is performed on the polycrystal epitaxial growth layer using the photoresist pattern 56 as an etch mask. The etch process 58 forms a body pattern 60 on the buried interlayer insulating layer 44. The body pattern 60 is over the main surface of the semiconductor substrate 10, as shown in FIG. 11. At this time, the body pattern 60 is formed to extend from one of the lower cell gate patterns 32 and overlap the sacrificial layer pad 52 and concurrently, isolate an upper active region 61. After the formation of the body pattern 60, the photoresist pattern 56 is removed from the semiconductor substrate 10.

A gate layer 62 and a gate capping layer 64 are sequentially formed on the buried interlayer insulating layer 44 to cover the body pattern 60. The gate capping layer 64 is preferably formed using a silicon oxynitride ($Si_xO_yN_z$) layer or silicon nitride layer. The gate layer 62 is preferably formed using a doped polysilicon layer.

Referring to FIG. 2 and FIGS. 12 to 14, photoresist patterns 66 are formed on the gate capping layer 64. An etch process 68 is sequentially performed on the gate capping layer 64 and the gate layer 62, using the photoresist patterns 66 as an etch mask. The etch process 68 forms upper cell gate patterns 63 facing each other on the upper active region 61. The upper cell gate patterns 63 are preferably formed to overlap the lower cell gate patterns 32 respectively. Further, a gate capping layer patterns 65 are disposed on the upper cell gate patterns 63. At this time, the upper cell gate patterns 63 and the gate capping layer patterns 65 expose the body pattern 60.

Figure 13:
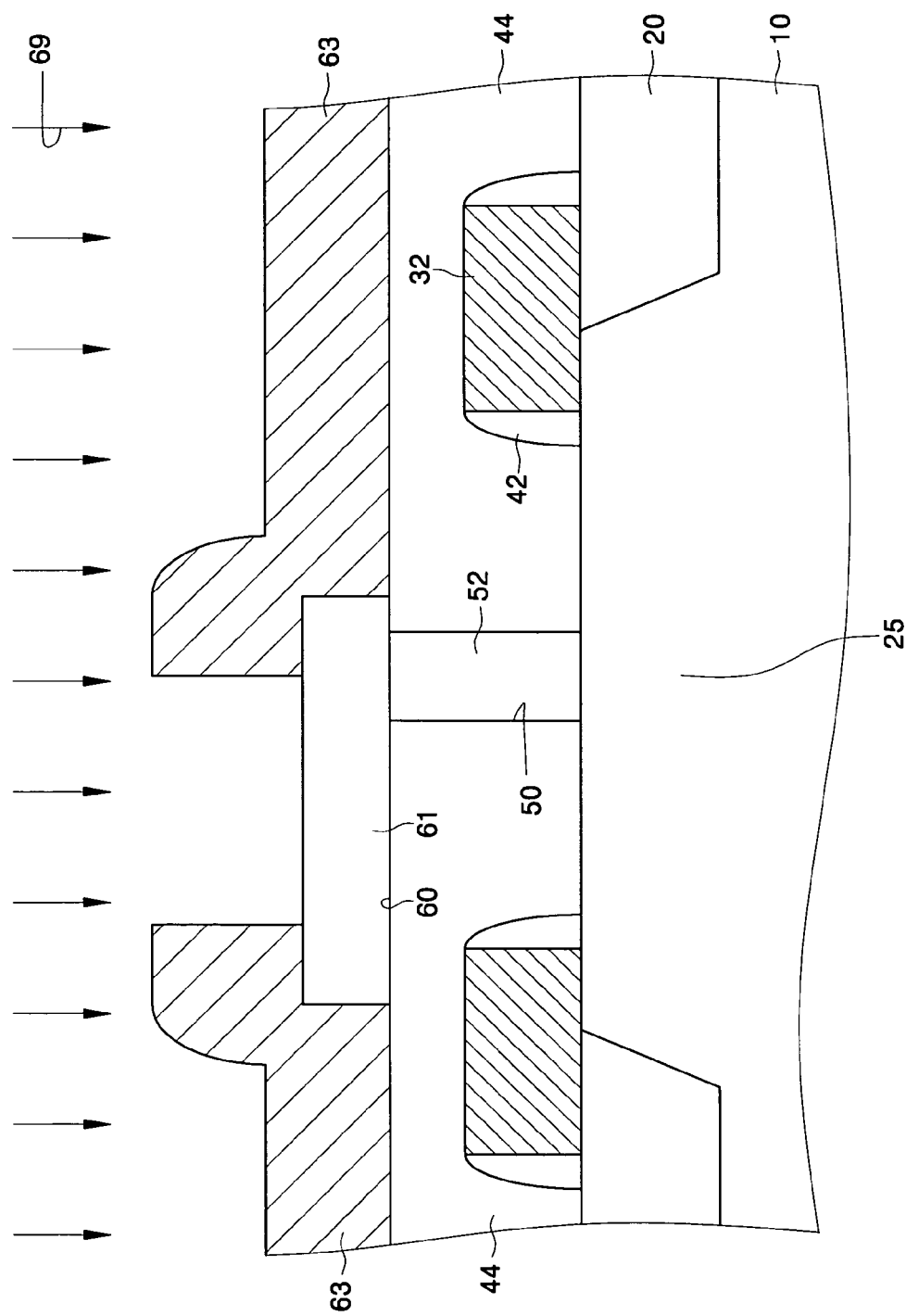

An etch process 69 is performed to remove the photoresist patterns 66 and the gate capping layer patterns 65 from the semiconductor substrate 10, as shown in FIG. 13. The etch process 69 is preferably performed to remain the upper cell gate patterns 63 on the buried interlayer insulating layer 44 and the upper active region 61. The etch process 69 is preferably performed using an etchant having an etch rate with respect to the photoresist patterns 66 and the gate capping layer patterns 65.

Figure 14:
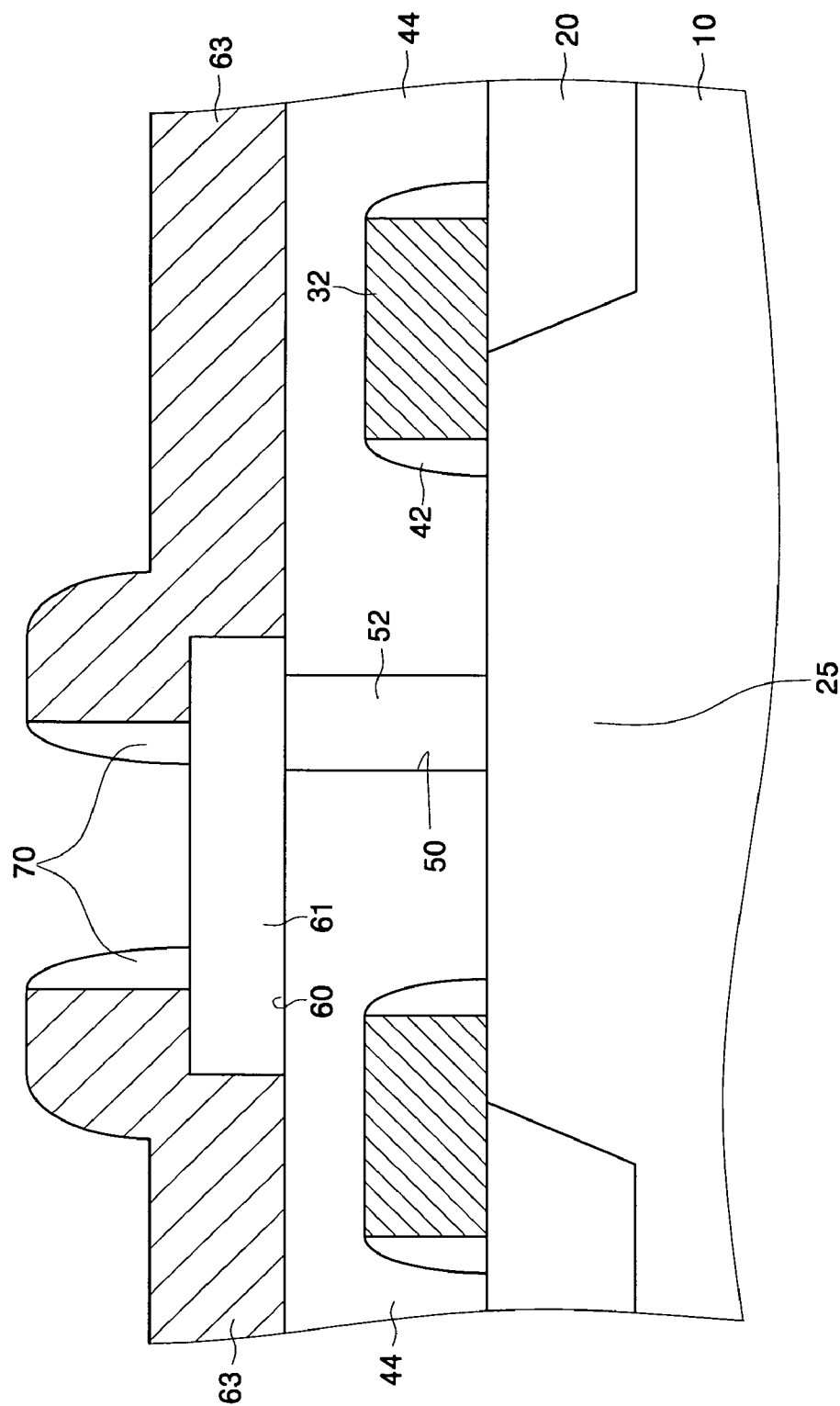
Figure 15:
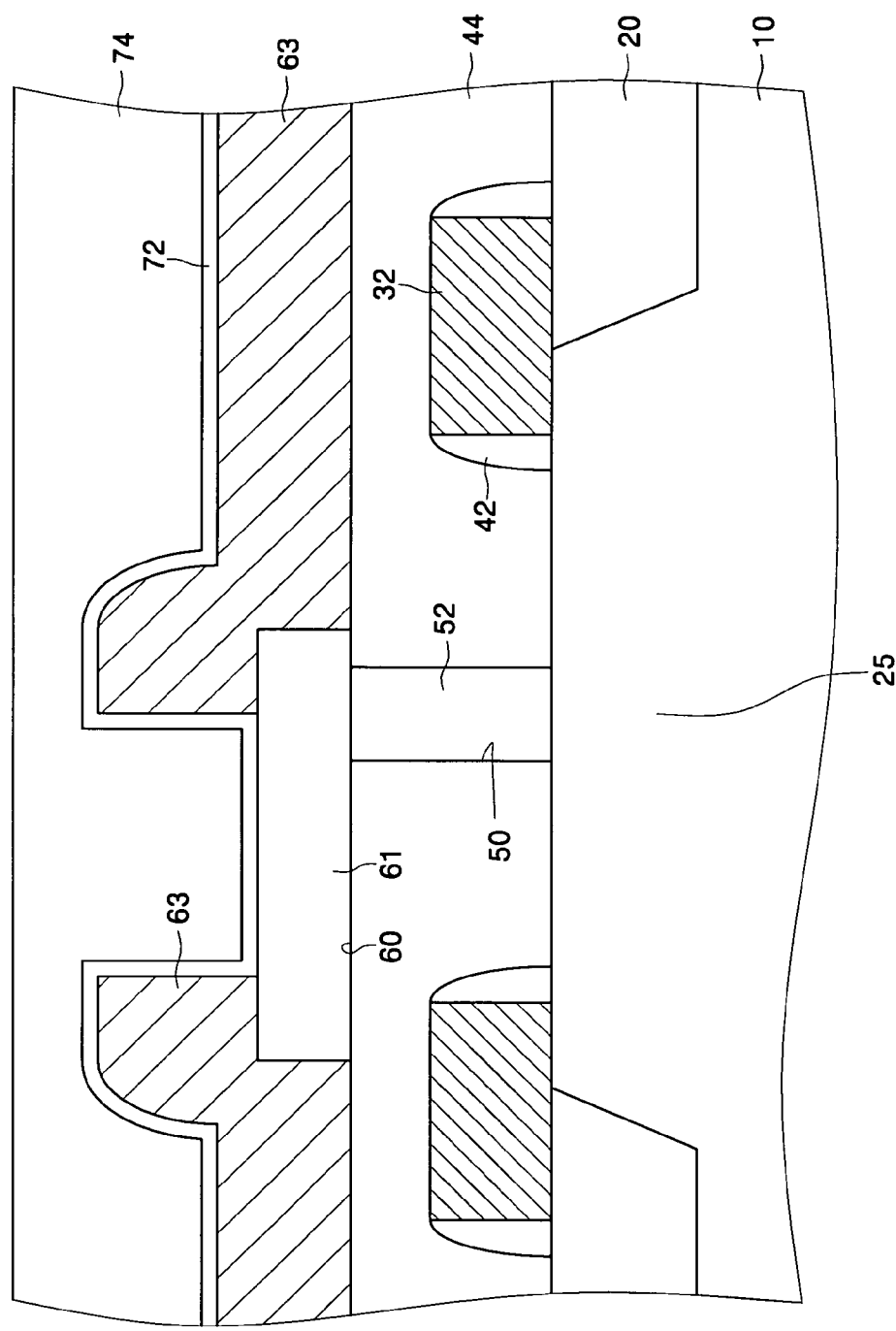

Upper gate spacers 70 are formed to cover the sidewalls of the upper cell gate patterns 63 respectively, as shown in FIG. 14. The upper gate spacers 70 are preferably formed using an insulating layer having the same etch rate as that of the lower gate spacers 42. Together with the formation of the upper gate spacers 70, the upper active region 61 may be formed to include P-type impurity regions. The P-type impurity regions may be formed using impurity ions predictable to constitute a P-type MOSFET.

Referring to FIG. 2 and FIGS. 15 to 17, the upper gate spacers 70 are removed from the semiconductor substrate 10. A semiconductor buffer layer 72 is formed on the body pattern 60 to conformably cover the upper cell gate patterns 63. The semiconductor buffer layer 72 is preferably formed using an insulating layer having the same etch rate as that of the buried interlayer insulating layer 44. Then, a planarized interlayer insulating layer 74 is formed on the semiconductor buffer layer 72 to fully fill between the upper cell gate patterns 63. The planarized interlayer insulating layer 74 is preferably formed using an insulating layer having the same etch rate as that of the buried interlayer insulating layer 44.

Figure 16:
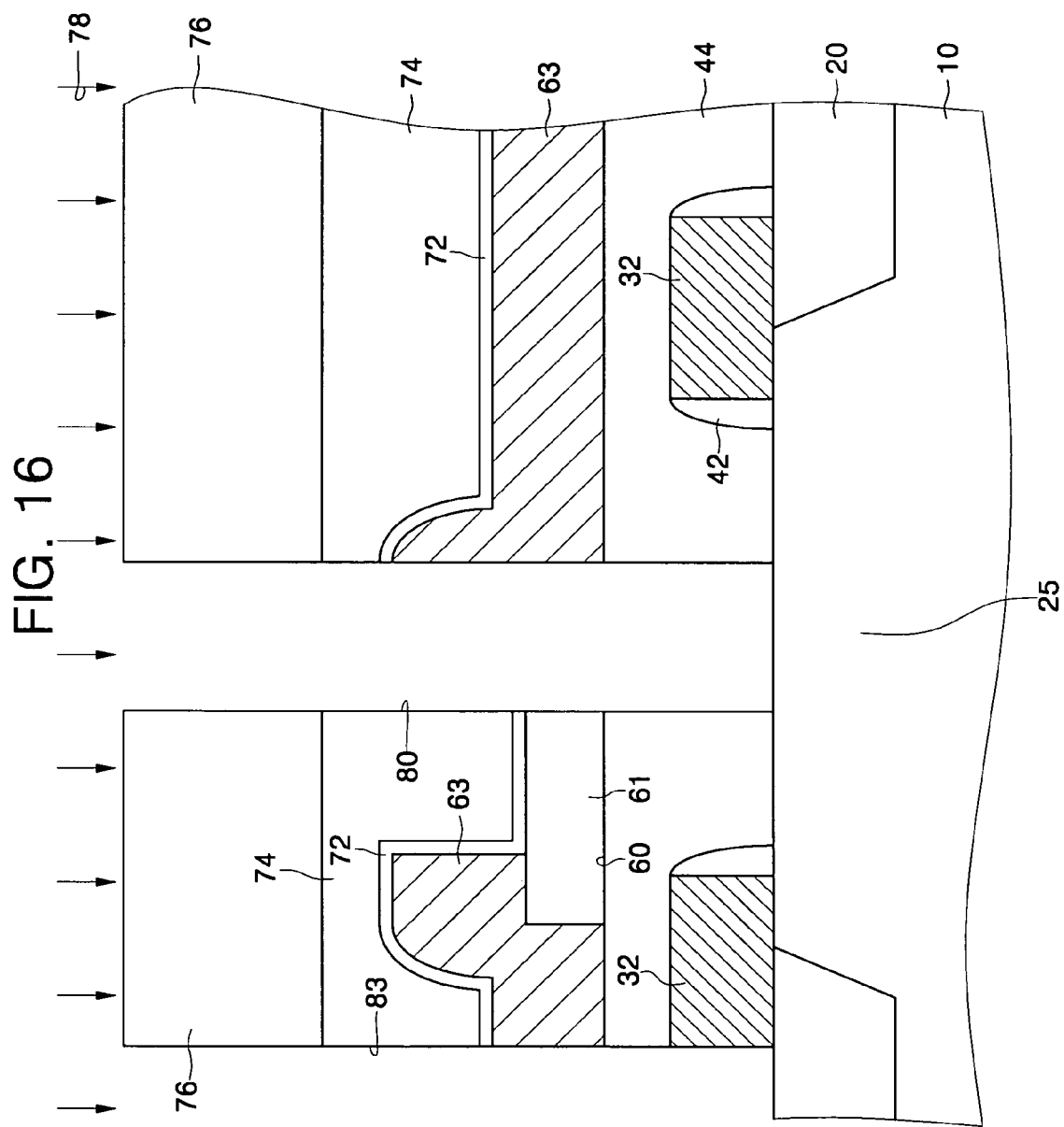
Figure 17:
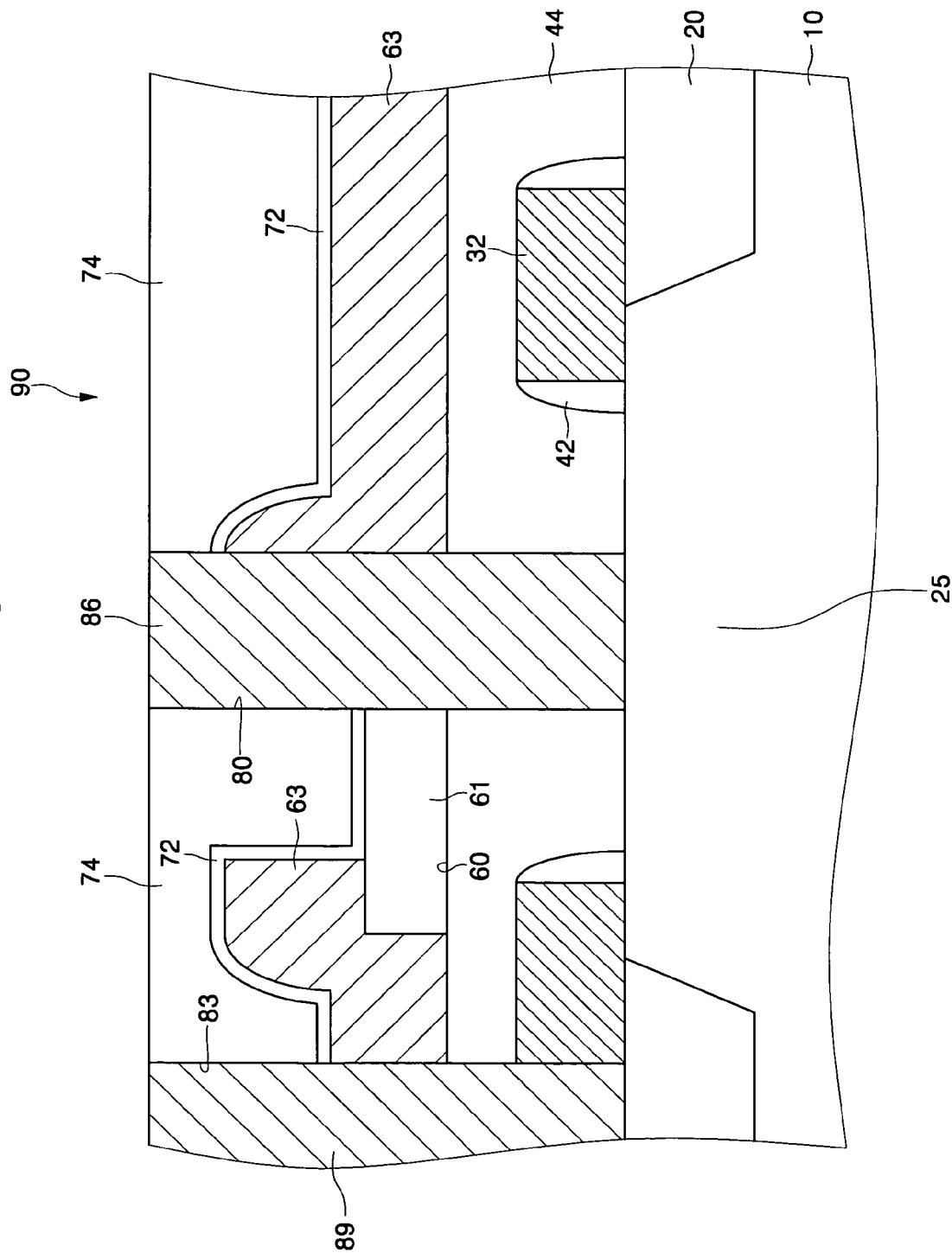

A photoresist layer 76 is formed on the planarized interlayer insulating layer 74, as shown in FIG. 16. The photoresist layer 76 is preferably formed to have openings on the planarized interlayer insulating layer 74. One of the openings is preferably formed between the lower cell gate patterns 32. The remaing opening is preferably formed to overlap the upper cell gate pattern 63 on the left side of FIG. 16. An etch process 78 is performed on the planarized interlayer insulating layer 74, the semiconductor buffer layer 72, the upper cell gate pattern 63, the sacrificial layer pad 52, the lower gate spacers 42, the buried interlayer insulating layer 44 and the lower cell gate patterns 32 through the opening, using the photoresist layer 76 as an etch mask. The etch process 78 forms pad holes 80, 83, which are isolated by the planarized interlayer insulating layer 74, the semiconductor buffer layer 72, and the buried interlayer insulating layer 44, and expose the semiconductor substrate 10 and the isolation layer 20 respectively. A diameter of each of the pad holes 80, 83 is preferably greater than that of the contact hole 50 of FIG. 9.

On the other hand, the pad hole 83 is formed to expose the upper cell gate pattern 63 of the left side of FIG. 16 and the underneath lower cell gate pattern 32. Then, the pad hole 80 is formed to expose the remaining upper cell gate pattern 63, the body pattern 60 and the semiconductor substrate 10. The etch process 78 is preferably performed to remove the sacrificial layer pad 52 during the formation of the pad hole 80. The etch process 78 forms the pad hole 80 having the same diameters in its upper and lower portions. This is because the etch process 78 can be performed by two steps of removing the silicon oxide layer and removing the silicon layer. Thus, since the etch process 78 does not face the upper gate spacers 70 on the sidewalls of the remaining upper cell gate patterns 63, the stability of the etch process 78 can be ensured. After the formation of the pad holes 80, 83, the photoresist layer 76 is removed from the semiconductor substrate.

A landing pad 86 and a node pattern 89 are formed to fully fill the pad holes 80, 83 respectively. The node pattern 89 and the landing pad 86 are preferably formed using a conductive layer. The node pattern 89 and the landing pad 86 are preferably formed using a polysilicon layer and a metal silicide layer, which are sequentially stacked. Alternatively, the node pattern 89 and the landing pad 86 may be singly formed using a doped polysilicon layer. The node pattern 89 and the landing pad 86 may be singly formed using a metal layer. Thus, an SRAM cell 90 is formed to have the node pattern 89 and the landing pad 86.

As described above, the present invention provides a structure of the SRAM cells having a landing pad being capable of stably connecting upper and lower gate patterns by eliminating the influence resulting from the structural characteristics in which the upper and lower gate patterns are vertically stacked. Therefore, the SRAM cells having the landing pad and the methods of forming the same provide an advantage of ensuring uniform electrical characteristics of the upper and lower gate patterns through an overall surface of a semiconductor substrate.

What is claimed is:

1. An SRAM cell having gate patterns vertically stacked on a cell array region comprising:
   a device isolation layer isolating at least one lower active region in a semiconductor substrate of the cell array region;
   a body pattern disposed in parallel with the semiconductor substrate and disposed on a vertical line passing through the lower active region so as to confine an upper active region;
   two lower cell gate patterns disposed on the lower active region, and upper cell gate patterns disposed on the lower cell gate patterns so as to overlap the lower cell gate patterns respectively and disposed in opposite to each other on the body pattern;
   a landing pad being in contact with one of the upper cell gate patterns and the body pattern, and disposed between the lower cell gate patterns;
   a node pattern spaced away from the landing pad with a predetermined distance, and disposed in contact with the remaining upper cell gate patterns and the underneath lower cell gate pattern; and
   a semiconductor buffer layer disposed to surround portions of sidewalls of the node pattern and the landing pad, and to conformally cover the upper active region and the upper cell gate patterns, wherein
   the node pattern and the landing pad contact the device isolation layer and the semiconductor substrate respectively, and interfaces between sidewalls of the upper cell gate patterns and the semiconductor buffer layer have a predetermined angle with respect to a main surface of the semiconductor substrate.

2. The SRAM cell according to claim 1, wherein the semiconductor buffer layer comprises a silicon oxide ($SiO_2$) layer.

3. The SRAM cell according to claim 1, wherein the node pattern and the landing pad comprise a conductive layer.

4. The SRAM cell according to claim 1, wherein the upper active region comprises impurity regions of a P-type MOSFET.

5. The SRAM cell according to claim 1, wherein the body pattern comprises a polycrystal silicon.

6. The SRAM cell according to claim 1, wherein the semiconductor substrate comprises a single crystal silicon.

7. The SRAM cell according to claim 1, wherein the lower active region comprises impurity regions of an N-type MOSFET.

8. The SRAM cell according to claim 1, wherein the lower and upper gate patterns comprise a doped polysilicon layer.

9. The SRAM cell according to claim 1, further comprising:
   a buried interlayer insulating layer disposed below the upper cell gate patterns, and surrounding the landing pad and the node pattern, wherein
   the buried interlayer insulating layer covers the lower cell gate patterns, and is an insulating layer having the same etch rate as that of the semiconductor buffer layer.

10. The SRAM cell according to claim 1, further comprising:
    a planarized interlayer insulating layer disposed on the upper cell gate patterns, and surrounding the landing pad and the node pattern, wherein
    the planarized interlayer insulating layer covers the semiconductor buffer layer, and is an insulating layer having the same etch rate as that of the semiconductor buffer layer.

11. The SRAM cell according to claim 1, further comprising:
    gate spacers covering sidewalls of the lower cell gate patterns respectively, wherein
    the gate spacers have an etch rate different from that of the semiconductor buffer layer.

12. The SRAM cell according to claim 1, wherein the isolation layer comprises at least one silicon oxide layer and at least one silicon nitride layer, which are sequentially stacked.

* * * * *